(12) United States Patent
Velidandla

(10) Patent No.: US 7,201,799 B1
(45) Date of Patent: Apr. 10, 2007

(54) SYSTEM AND METHOD FOR CLASSIFYING, DETECTING, AND COUNTING MICROPIPES

(75) Inventor: Vamsi Velidandla, Santa Clara, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 127 days.

(21) Appl. No.: 10/997,328

(22) Filed: Nov. 24, 2004

(51) Int. Cl.
*C30B 25/12* (2006.01)

(52) U.S. Cl. ............................... 117/2; 117/1
(58) Field of Classification Search .................... 117/1, 117/2; 250/559.45
See application file for complete search history.

(56) References Cited

U.S. PATENT DOCUMENTS

| | | | |
|---|---|---|---|
| 3,885,875 | A | 5/1975 | Rosenfeld et al. |
| 4,182,259 | A | 1/1980 | Garner et al. |
| 4,332,477 | A | 6/1982 | Sato |
| 4,585,348 | A | 4/1986 | Chastang et al. |
| 4,668,860 | A | 5/1987 | Anthon |
| 4,870,631 | A | 9/1989 | Stoddard |
| 4,873,430 | A | 10/1989 | Juliana et al. |
| 5,017,012 | A | 5/1991 | Merritt, Jr. et al. |
| 5,129,724 | A | 7/1992 | Brophy et al. |
| 5,189,481 | A | 2/1993 | Jann et al. |
| 5,196,906 | A | 3/1993 | Stover et al. |
| 5,270,794 | A | 12/1993 | Tsuji et al. |
| 5,293,216 | A | 3/1994 | Moslehi |
| 5,313,542 | A | 5/1994 | Castonguay |
| 5,406,082 | A | 4/1995 | Pearson et al. |
| 5,416,594 | A | 5/1995 | Gross et al. |
| 5,446,549 | A | 8/1995 | Mazumder et al. |
| 5,463,897 | A | 11/1995 | Prater et al. |

(Continued)

FOREIGN PATENT DOCUMENTS

JP 3-221804 9/1991

(Continued)

OTHER PUBLICATIONS

W.C. Leung, W. Crooks, H. Rosen and T. Strand, *An Optical Method Using a Laser and an Integrating Sphere Combination for Characterizing the Thickness Profile of Magnetic Media*, Sep. 1989, IEEE Transaction on Magnetics, vol. 25, No. 5. pp. 3659-3661.

(Continued)

*Primary Examiner*—Felisa Hiteshew
(74) *Attorney, Agent, or Firm*—Caven & Aghevli LLC

(57) ABSTRACT

An automated, non-invasive method for classifying, detecting, and counting micropipes contained within silicon wafers, and generally any assortment of transparent wafers. Classifying, detecting, and counting micropipes takes place through the use of a data processing algorithm that incorporates information regarding: defect size; pit signature; area of pit signature when comparing a topography, specular, or scatter images; and detecting a tail within the standard pit signature. The method of the present invention teaches the development of a topography defect map, specular defect map, and scatter defect map for a complete analysis of the surface of a particular transparent wafer. Conventional detection, classification, and counting of micropipes involve characterization of micropipes in a manual fashion and rely upon an extremely invasive form of sample preparation. The method disclosed in the present invention is completely automated and non-invasive with regards to the treatment of the transparent wafer to be analyzed.

22 Claims, 17 Drawing Sheets

U.S. PATENT DOCUMENTS

| | | |
|---|---|---|
| 5,586,101 A | 12/1996 | Gage et al. |
| 5,608,527 A | 3/1997 | Valliant et al. |
| 5,610,897 A | 3/1997 | Yamamoto et al. |
| 5,631,171 A | 5/1997 | Sandstrom et al. |
| 5,633,747 A | 5/1997 | Nikoonahad |
| 5,644,562 A | 7/1997 | de Groot |
| 5,694,214 A | 12/1997 | Watanabe et al. |
| 5,715,058 A | 2/1998 | Bohnert et al. |
| 5,726,455 A | 3/1998 | Vurens |
| 5,748,305 A | 5/1998 | Shimono et al. |
| 5,754,297 A | 5/1998 | Nulman |
| 5,777,740 A | 7/1998 | Lacey et al. |
| 5,798,829 A | 8/1998 | Vaez-Iravani |
| 5,864,394 A | 1/1999 | Jordan, III et al. |
| 5,875,029 A | 2/1999 | Jann et al. |
| 5,880,838 A | 3/1999 | Marx et al. |
| 5,903,342 A | 5/1999 | Yatsugake et al. |
| 5,909,276 A | 6/1999 | Kinney et al. |
| 5,951,891 A | 9/1999 | Barenboim et al. |
| 5,978,091 A | 11/1999 | Jann et al. |
| 5,985,680 A | 11/1999 | Singhal et al. |
| 5,986,761 A | 11/1999 | Crawforth et al. |
| 5,986,763 A | 11/1999 | Inoue |
| 5,995,226 A | 11/1999 | Abe et al. |
| 6,028,671 A | 2/2000 | Svetkoff et al. |
| 6,034,378 A | 3/2000 | Shiraishi |
| 6,043,502 A | 3/2000 | Ahn |
| 6,081,325 A | 6/2000 | Leslie et al. |
| 6,088,092 A | 7/2000 | Chen et al. |
| 6,091,493 A | 7/2000 | Stover et al. |
| 6,107,637 A | 8/2000 | Watanabe et al. |
| 6,118,525 A | 9/2000 | Fossey et al. |
| 6,134,011 A | 10/2000 | Klein et al. |
| 6,157,444 A | 12/2000 | Tomita et al. |
| 6,169,601 B1 | 1/2001 | Eremin et al. |
| 6,172,752 B1 | 1/2001 | Haruna et al. |
| 6,201,601 B1 | 3/2001 | Vaez-Iravani et al. |
| 6,248,988 B1 | 6/2001 | Krantz |
| 6,271,916 B1 | 8/2001 | Marxer et al. |
| 6,307,627 B1 | 10/2001 | Vurens |
| 6,353,222 B1 | 3/2002 | Dotan |
| 6,384,910 B2 | 5/2002 | Vaez-Iravani et al. |
| 6,509,966 B2 | 1/2003 | Ishiguro et al. |
| 6,515,745 B2 | 2/2003 | Vurens et al. |
| 6,542,248 B1 | 4/2003 | Schwarz |
| 6,603,542 B1 | 8/2003 | Chase et al. |
| 6,630,996 B2 | 10/2003 | Rao et al. |
| 6,639,662 B2 | 10/2003 | Vaez-Iravani et al. |
| 6,757,056 B1 | 6/2004 | Meeks et al. |
| 6,804,003 B1 | 10/2004 | Wang et al. |
| 6,809,809 B2 | 10/2004 | Kinney et al. |
| 6,825,487 B2 * | 11/2004 | Preece ................ 250/559.4 |
| 6,900,892 B2 * | 5/2005 | Shchegrov et al. ......... 356/369 |

FOREIGN PATENT DOCUMENTS

| | | |
|---|---|---|
| JP | 04-162215 | 5/1992 |
| JP | 10-227764 | 8/1998 |
| JP | 11-173994 | 7/1999 |
| WO | WO 98/52019 | 11/1998 |

OTHER PUBLICATIONS

Steven W. Meeks, Walter E. Weresin, and Hal J. Rosen, *Optical Surface Analysis of the Head-Disk-Interface of Thin Films Disks*, Jan. 1995, Transactions of the ASME, Journal of Tribology, vol. 117, pp. 112-118.

Steven Meeks, Maxtor and Rusmin Kudinar, *The Next Battleground: Head-Disk Interface*, Mar. 1998, Data Storage, Test & Measurement, pp. 29-30, 34 and 38.

*Laser Scanning Surface Profilometer*, [online], Aug. 1970, [retrieved Jan. 29, 2001], pp. 789-790, Retrieved from the Internet: <URL: http://www.delphion.com/tdbs/tdb?&order=7OC101758.

Meeks, Steven W.: "A Combined Ellipsometer, Reflectometer, Scatterometer and Kerr Effect Microscope for Thin Film Disk Characterization," Machine Vision Applications in Industrial Inspection VIII, Proceedings of SPIE, vol. 3966, 2000, pp. 385-391, XP001085220.

* cited by examiner

SYSTEM AND METHOD FOR CLASSIFYING, DETECTING, AND COUNTING MICROPIPES

BACKGROUND OF THE INVENTION

1. Field of the Invention

The present invention generally relates to the field of optical surface analyzers and more specifically to the characterization and mapping of micropipes (screw dislocations) on grown wafers.

2. Description of Background Art

Silicon carbide (SiC) wafers are used in a variety of industries such as power devices for automobiles and high frequency communication devices. During the production of these wafers, the crystalline structure is subjected to various internal and external stresses that can cause the growth of defects, or dislocations, within the atomic lattice. A screw dislocation is a common dislocation that transforms successive atomic planes within a crystalline lattice into the shape of a helix. Once a screw dislocation propagates through the bulk of a sample during the wafer growth process, a micropipe is formed. The presence of a high density of micropipes within a wafer will result in a loss of yield in the device manufacturing process. Therefore, identifying, classifying, and counting micropipes in a systematic way will help control the SiC wafer manufacturing process and improve device yield.

Current techniques for detecting, counting, and mapping dislocations and micropipes for thin film manufacture rely upon a manual process that involves etching the thin film wafer with a potassium hydroxide (KOH) solution and then retrieving micropipe characterization data through an optical reflection microscope. This process is both destructive to the sample, due to the harsh nature of the KOH etch, and is time consuming, because of the large amount of data that is generated for accurate inspection of the micropipe sites. Etching micropipes with a KOH solution widens the opening of the micropipe, which does allow for easier inspection; however, the wafer is destroyed in the process, which in turn, drives up the cost of manufacture. Also, automated inspection of the micropipe sites has been confined to a manual process where a series of JPEG or BITMAP images of the wafer obtained via a cross-polarization technique are stitched together and analyzed for micropipes. Again, the current techniques are both destructive to the sample and inspect the samples less efficiently, thus translating to a high cost for manufacture.

Conventional optical surface analysis techniques have been used for analysis of transparent wafers; however, significant shortcomings exist. Conventional surface analysis systems are not provided with automated capabilities to collect surface data and cannot avoid contamination of the reflected signals from the top surface of a transparent wafer by reflected light from the back side of a transparent wafer.

What is needed is an automated method for characterizing micropipes contained within silicon wafers, and transparent wafers that: a) detects micropipes; b) classifies micropipes; and c) counts micropipes; through the use of a data processing algorithm that incorporates information regarding: (1) defect size; (2) pit signature; (3) area comparison with specular and scatter images; and (4) tail detection in the specular image.

SUMMARY OF THE INVENTION

The present invention overcomes the limitations of the conventional systems by enabling the detection, classification, and counting of micropipes contained within a SiC wafer in a fully automated and non-invasive manner through the use of an optical surface analyzer (OSA) and a unique data processing algorithm that accurately identifies micropipe defects. Within the structure of the data processing algorithm of the present invention, information regarding the size of a defect, the shape of the defect, the area of a defect, and the presence of a tail within the defect signature is produced in order to make an accurate determination regarding the presence of a micropipe.

DETAILED DESCRIPTION OF THE INVENTION

Figure 1:
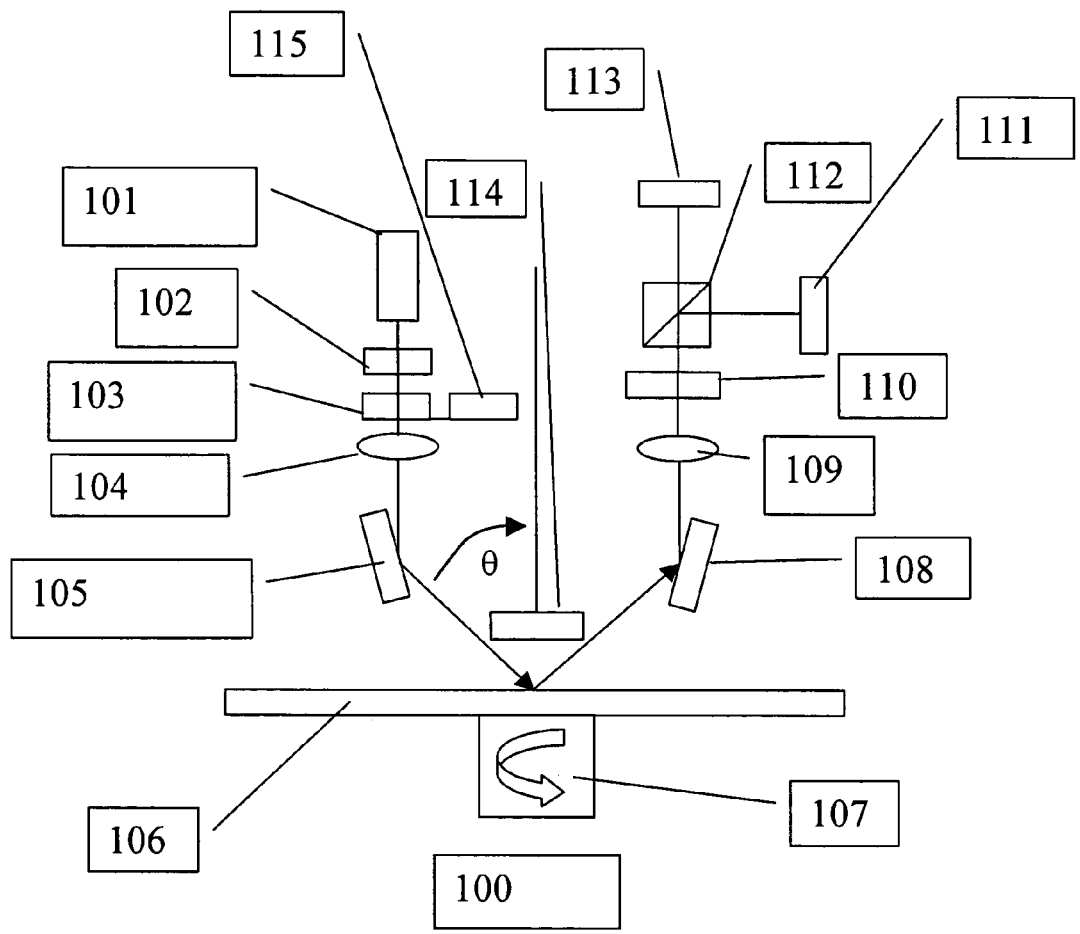
FIG. 1 is one half of optical layout of combined ellipsometer and optical profiler (side view) according to one embodiment of the present invention.

A preferred embodiment of the present invention is now described with reference to the figures where like reference numbers indicate identical or functionally similar elements. Also in the figures, the left most digits of each reference number corresponds to the figure in which the reference number is first used.

Reference in the specification to "one embodiment" or to "an embodiment" means that a particular feature, structure, or characteristic described in connection with the embodiments is included in at least one embodiment of the invention. The appearances of the phrase "in one embodiment" in various places in the specification are not necessarily all referring to the same embodiment.

Some portions of the detailed description that follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations of physical quantities as modules or code devices, without loss of generality.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device, that manipulates and transforms data represented as physical (electronic) quantities within the computer system memories or registers or other such information storage, transmission or display devices.

Certain aspects of the present invention include process steps and instructions described herein in the form of an algorithm. It should be noted that the process steps and instructions of the present invention could be embodied in software, firmware or hardware, and when embodied in software, could be downloaded to reside on and be operated from different platforms used by a variety of operating systems.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatus to perform the method steps. The structure for a variety of these systems will appear from the description below. In addition, the present invention is not described with reference to any particular programming language. It will be appreciated that a variety of programming languages may be used to implement the teachings of the present invention as described herein, and any references below to specific languages are provided for disclosure of enablement and best mode of the present invention.

In addition, the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the following claims.

The present invention enables the detection, classification, and counting of micropipes contained within a wafer in a fully automated and non-invasive manner through the use of an optical surface analyzer (OSA) and a unique data processing algorithm.

A double-sided optical inspection system and method is provided which may detect and classify particles, pits and scratches on thin wafers in a single scan of the surface. In one embodiment of the present invention the double-sided optical inspection system uses two or more light beams with different planes of incidence, such as orthogonally oriented beams, that are directed at both surfaces of the object. In an alternate embodiment, a single beam can be used which is split and directed toward both sides of the object in accordance with the description below. In one embodiment, the scattered light intensities produced when the beam strikes a defect are separated by to their polarization. In another embodiment, the scattered light intensities are separated by their wavelength. The separated scattered light intensities are measured by a detector. The scattered light intensities of the beams are compared to determine the aspect ratio of the defect. The method can categorize defects that are smaller than the size of the beam spot on the object surface.

FIG. 1 is an illustration of an apparatus for measuring properties of the wafer according to an embodiment of the present invention. The apparatus uses a focused laser light signal whose angle of propagation θ (as shown in FIG. 1) can be between zero degrees from normal and ninety degrees from normal.

One embodiment of the apparatus 100 includes a conventional laser diode 101, e.g., RLD65MZT1 or RLD-78MD available from Rolm Corporation, Kyoto, Japan, which has been collimated by Hoetron Corp., Sunnyvale, Calif., e.g., a conventional linear polarizer 102, e.g., made of Polarcor that is commercially available from Newport Corp., Irvine, Calif., a conventional half wave plate 103 that is commercially available from CVI Laser, Livermore Calif., a conventional focusing lens 104 that is commercially available from Newport Corporation, Irvine, Calif., conventional mirrors 105 and 108 available from Newport Corp. Irving, Calif. A collimating lens 109 available from Newport Corp., a quarter wave plate 110 available from CVI Laser Corp., a conventional polarizing beam splitter 112 rotated at 45° to the plane of incidence available from CVI Laser Corp., a pair of conventional quadrant detectors 111 and 113 available from Hamamatsu Corp., Hamamatsu City, Japan, a conventional avalanche photodiode 114 available from Advanced Photonix, Inc., Camarillo, Calif. and a conventional motor 115 available from Maxon Precision Motors, Burlingame, Calif. for rotating the half wave plate 103. The avalanche photodiode 114 may be replaced with a conventional photo multiplier tube (PMT) available from Hamamatsu Corp., Hamamatsu City, Japan.

A laser diode 101 emits an electromagnetic signal toward the r silicon wafer, photonics wafer or glass substrate. In an embodiment the electromagnetic signal is a light signal having a wavelength of 780 or 655 nanometers (nm) although a wide variety of wavelengths can be used. The angle of propagation of the light signal can be any angle θ between zero and ninety degrees.

Laser diodes are well known to have an internal photodiode to monitor the laser output power. An embodiment of a feedback control circuit to control the optical intensity is to use such a photodiode, which is internal to the laser diode. This photodiode which is internal to the laser diode feeds back a control signal to negative feedback circuitry and by doing so keeps the intensity of the laser at a constant value. The photodiode that is used to control the laser intensity may be external to the laser. When an external photodiode is used, an external non-polarizing beam splitter is placed after the laser. This external non-polarizing beam splitter directs a sample of the laser onto the external photodiode. The signal from the external photodiode is used to feedback a control signal to negative feedback circuitry and thereby controls the laser intensity. Another means of keeping an approximate constant output power of the laser is to control the current of the laser diode, that is, run the diode laser in a constant current mode. The laser diode will exhibit a very slow decrease in output power over a period of months. As long as the scan time is less than 5 or 10 minutes then the optical power output of the laser will remain constant during the scan. The advantage of this technique is its simplicity. Long-term drifts of the laser output power may be calibrated out of the system by first measuring a standard reflector and using this to normalize the measured signals. The value of the signal is first measured over the standard (known) reflector and then the wafer is measured. If there has been any drift of the standard reflector measurement then all the data is corrected for this amount of drift. As a result long-term drifts may be compensated even when operating in a constant current mode. The emitted light passes through the linear polarizer 102. The linear polarizer 102 improves the linear polarization of the laser light signal.

The linearly polarized light passes through a mechanically rotatable half-wave plate 103. The half wave plate 103 is attached to a miniature motor 115 which allows the polarization to be dynamically rotated between P polarized (parallel to the plane of incidence), S polarized (perpendicular to the plane of incidence) and 45° polarized (between P and S) light. The polarized light passes through a focusing lens 104 and is directed onto a silicon wafer or transparent substrate 106 by a turning mirror 105. The reflected signal is directed to the detection optics by another turning mirror 108 and recollimated by another lens 109. An avalanche photodiode, conventional PIN photodiode or photo multiplier tube 114, for example, detects the scattered component of the signal.

The recollimated beam passes through a quarter wave plate 110 that is used to adjust the polarization of the beam so that equal amounts of energy are directed into the quadrant photodetectors 113 and 111. After passing through the quarter wave plate 110 the beam is split by a polarization beam splitter 112 that is rotated by 45° to the plane of incidence. In another embodiment, the polarizing beam splitter may be a Wollaston prism or a Glan Thompson or a Rochon prism beam splitter. The split beams are directed onto two quadrant detectors 111 and 113. The quadrant detectors are used to compute the phase shift between the split beams, the reflectivity, the optical profiles in the radial and circumferential directions, and the Kerr rotation. The outputs from the quadrant detectors are digitized by a conventional analog to digital converter and directed to the memory of a conventional personal computer. The signals are then analyzed by the personal computer to detect defects, measure topography, and measure stains. The entire optical apparatus 100 is placed upon a stage that moves the apparatus in the radial direction while a motor 107 rotates the sample 106. In this manner the entire surface of the sample 106 may be scanned for defects.

An alternative embodiment for scanning the entire substrate 106 is to place the optical head or the substrate 106 on a x-y scan stage. The substrate 106 or the optical apparatus 100 is scanned in the x and y directions and in this manner the entire sample may be scanned for defects or topography.

Figure 2:
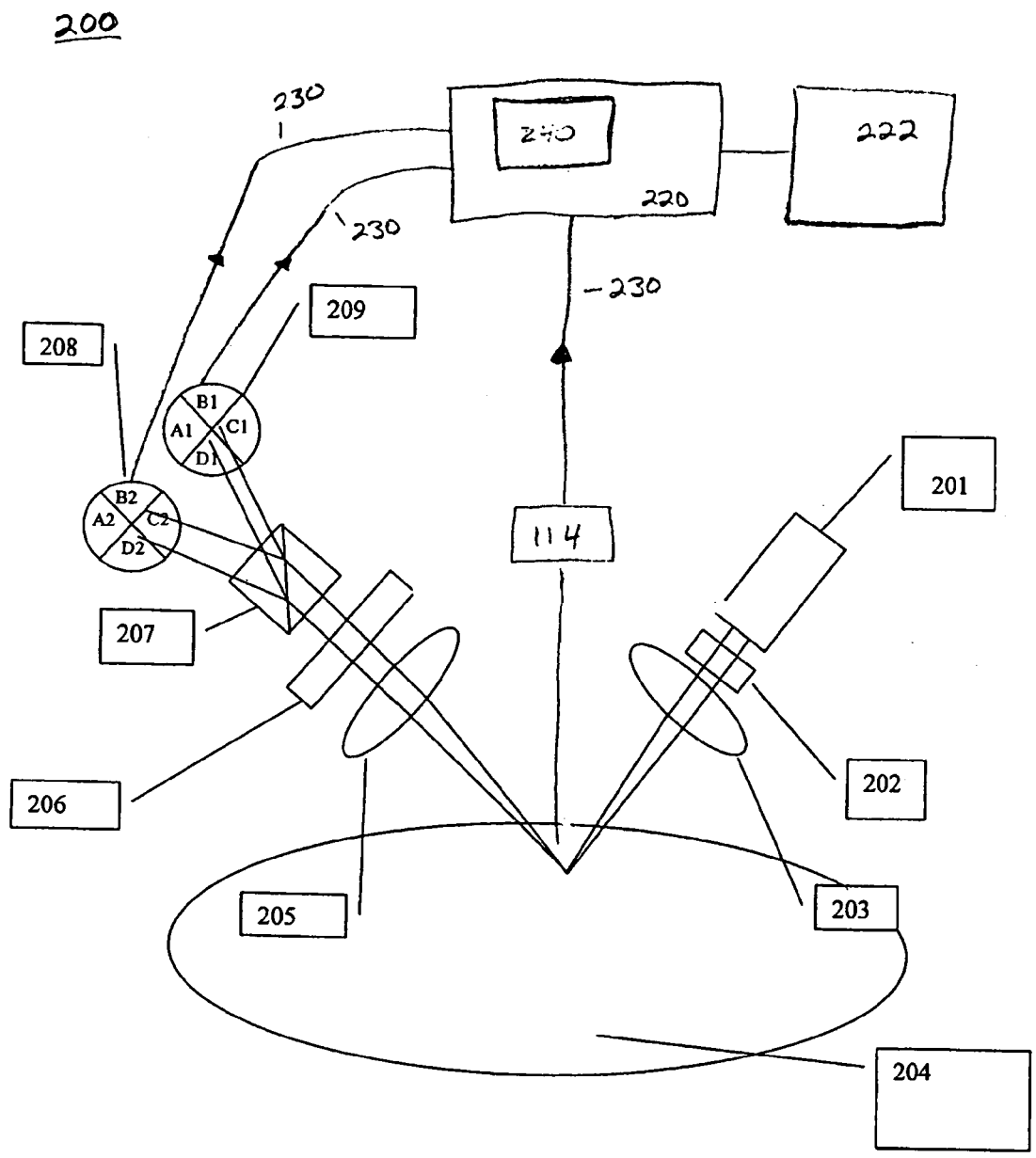
FIG. 2 is an illustration of a miniature optical surface analyzer according to one embodiment of the present invention.
Figure 3:
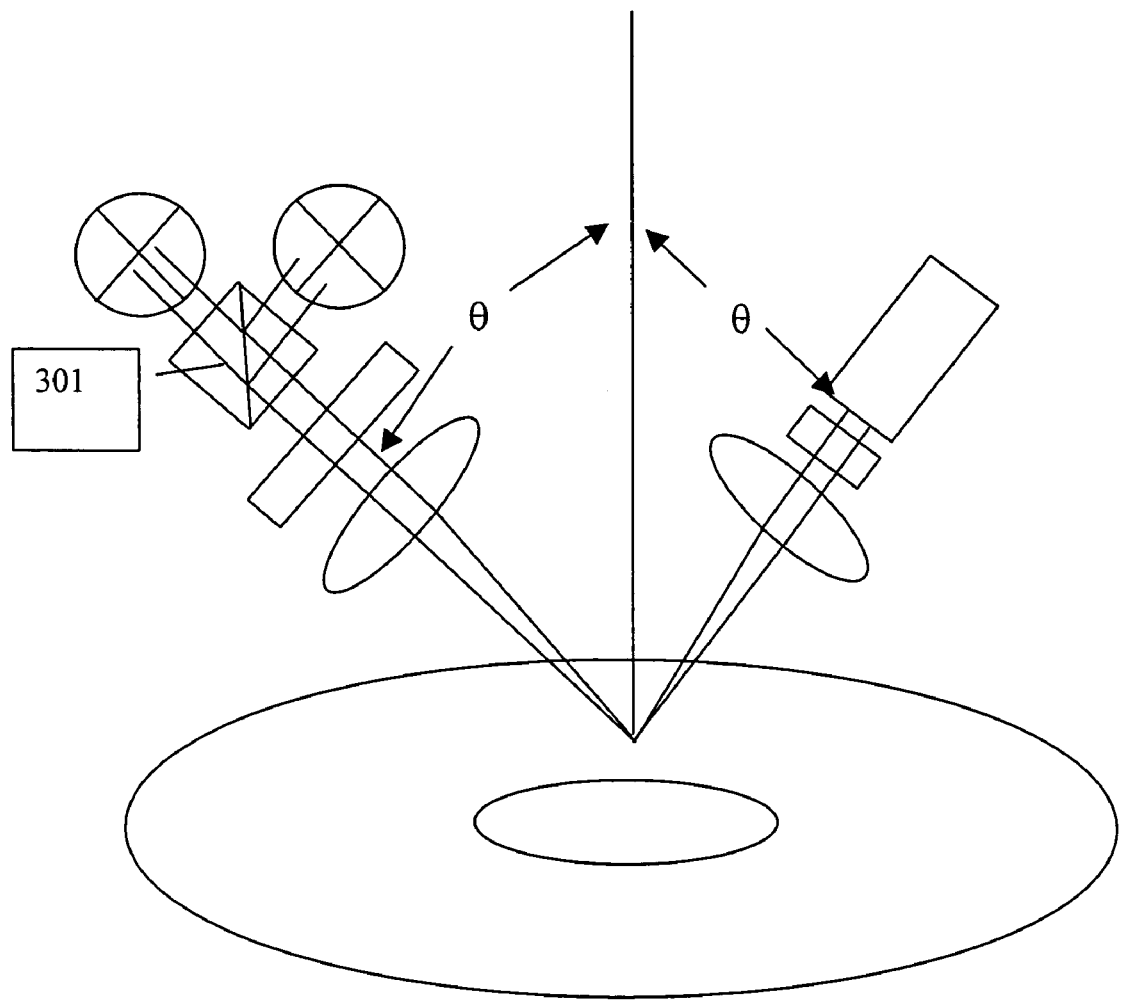
FIG. 3 is an illustration of a miniature optical surface analyzer according to another embodiment of the present invention.
Figure 4:
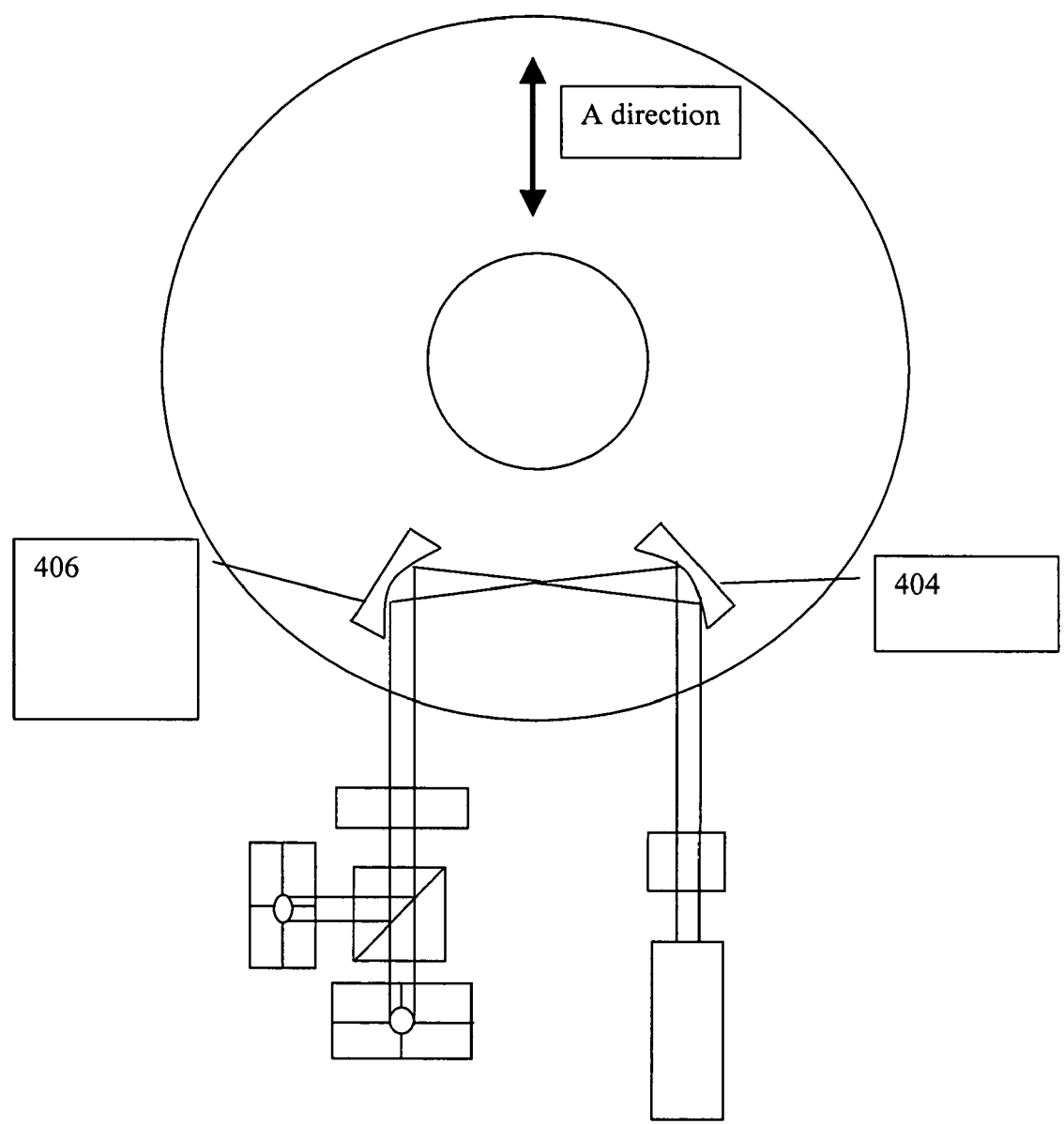
FIG. 4 is an illustration of a miniature optical surface analyzer according to another embodiment of the present invention from a top view perspective.

If both sides of a wafer need to be inspected simultaneously, a solution can be obtained by using the optical designs shown in FIGS. 2, 3, 4, and/or 5. These designs have several improvements, which allow the design to be miniaturized without compromising the performance of the device. First of all the design uses the internal feedback photodiode, which is included within the laser diode 201, to achieve stabilization of the DC level of the optical signal. Secondly, the angle of incidence, θ, is adjusted to reduce the height of the instrument so that it will fit within a small, e.g., 1 inch, space requirement. Thirdly, the surface topography measurement capability feature of the instrument is incorporated within the phase/specular detectors 208 and 209 shown in FIGS. 2 and 3. The position sensitive detectors 208 and 209 (quadrant detectors) serve as both phase detectors, specular detectors, and topography measurement detectors. Fourthly, the size may be decreased by using a polarizing beam splitter 301 as shown in FIG. 3 instead of a Wollaston prism 207 as shown in FIG. 2. The polarizing beam splitter 207 or Wollaston prism 301 is rotated at 45° with respect to the plane of incidence.

A preferred embodiment of the present invention contains an analysis system 200 that contains a defect processing algorithm 240 for classifying, counting, and detecting micropipes. The defect processing algorithm 240 is driven by microprocessor 222 and stored in memory unit 220. In this embodiment, both position sensitive detectors 208 and 209 and scatter detector 114 are coupled to memory unit 220 by way of connection 230.

Figure 5:
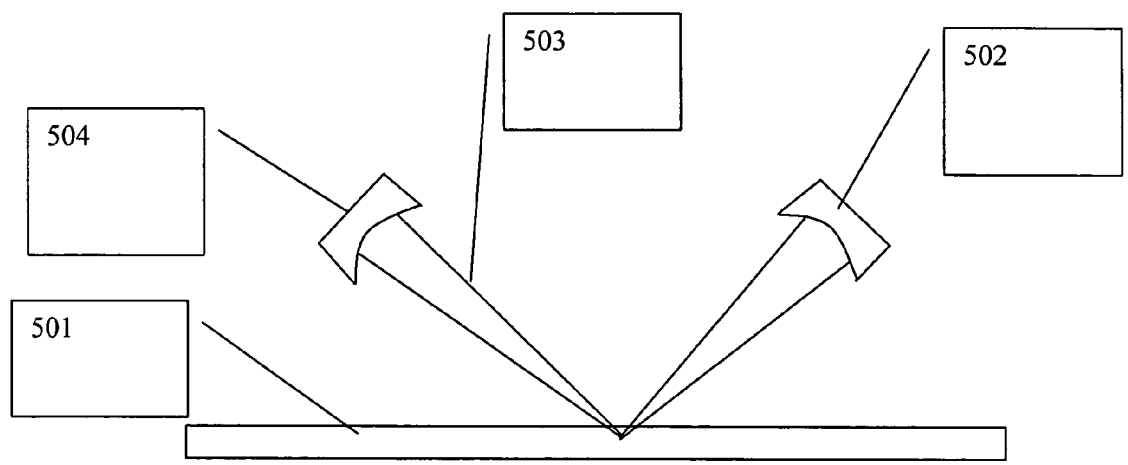
FIG. 5 is an illustration of a miniature optical surface analyzer of FIG. 4 from the perspective from the A direction.
Figure 6:
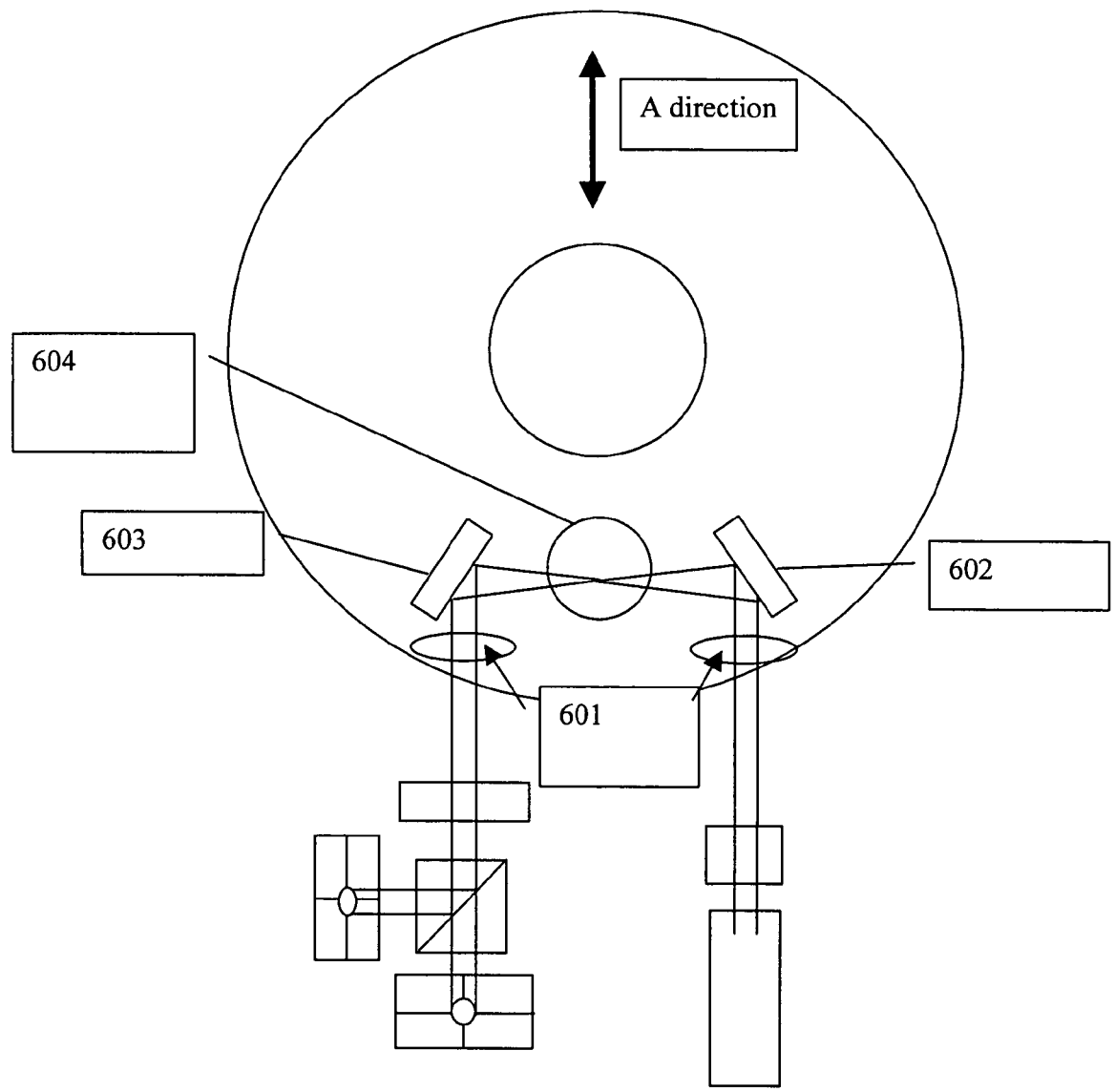
FIG. 6 is an illustration of a miniature optical surface analyzer according to another embodiment of the present invention from a top view perspective.

Another embodiment of this invention can use a beam splitter that splits the beam into non-orthogonal components, which will be discussed in below. Using two spherical mirrors 404 and 406 to direct the beam onto the wafer as shown in FIG. 4 will diminish the size in the lateral dimension. The mirrors 404 and 406 are adjusted at a compound angle as shown in FIG. 4. This is also shown in FIG. 5 which is a view of FIG. 4 along the "A" direction, where the mirrors 502, 504 are at a compound angle. These mirrors direct the beam 503 onto the wafer 501. In addition to directing the beam onto the wafer the spherical mirrors also focus the beam to a small spot. In an alternative embodiment flat mirrors 602 and 603 are used in combination with focusing lenses 601 as shown in FIG. 6. Also shown in FIG. 6 is a silicon photodetector or avalanche photodiode or photo multiplier tube 604, which is positioned above the point where the beam strikes the wafer. This element enables the detection of submicron particles. The avalanche photodiode 604 is available from Advanced Photonix, Inc., Camarillo, Calif.

Referring to FIG. 2, the laser beam from the laser 201 passes through a linear polarizer 202, and a focusing lens 203 and then strikes a wafer 204. Upon reflecting from the surface the beam passes through a collimating lens 205, a quarter wave plate 206, and through a polarizing beam splitter such as Wollaston prism 207 which is rotated at 45° to the plane of incidence and onto two quadrant detectors 208 and 209. The specular signal is obtained by summing the quadrant signals from a first position sensitive detector 209 (A1, B1, C1, D1) with the sum of the quadrant signals of a second position sensitive detector (A2, B2, C2, D2), 208 times a constant K:

Specular signal=$(A1+B1+C1+D1)+\kappa*(A2+B2+C2+D2)$

The cosine of the phase shift between the two split beams (Cos(ps)) can be obtained by subtracting the sum of the elements of the first position sensitive detector 209 from the sum of the elements of the second position sensitive detector, 208 times a constant K:

Cos(ps)=$(A1+B1+C1+D1)+\kappa*(A2+B2+C2+D2)$.

Referring to FIG. 2, the first position sensitive detector 209, the slope in the circumferential direction is given by:

Slope in circumferential direction=$[(B1+C1)-(A1+D1)]/(A1+B1+C1+D1)$

The slope in the radial direction is given by:

Slope in the radial direction=$[(A1+B1)-(C1+D1)]/(A1+B1+C1+D1)$

The topography in the circumferential or radial direction is obtained by integrating the slope in the circumferential or radial direction, respectively. The slope signals can also be obtained from the position sensitive detectors (208, 209) with the same equations as shown above except for substituting 2 for 1.

Using the designs shown in FIGS. 2, 3, 4, 5 and 6 will allow the measurement of sub-micron scratches, particles, stains, pits, mounds, handling damage, wear of the carbon layer, outside diameter damage and contamination. This design can also measure the longitudinal Kerr effect by a measurement of the Kerr rotation angle. The advantages of this design are its small size which is made possible by detectors which combine the measurement of phase shift, specular reflectivity, radial and circumferential slope, and scattered light.

The optical surface analysis tool of FIGS. 1–6 is also capable of locating certain structural defects within the core of a wafer that will allow the production of higher yield, semiconducting material, like silicon. One of the most common defects found during the growth of semiconducting material, like silicon carbide (SiC), is an open core, screw dislocation called a micropipe. Micropipes can be either parallel or perpendicular to the surface of the substrate or wafer. In one embodiment, the optical surface analyzer (OSA) 100 of the present invention illuminates the wafer with an oblique incidence laser beam. The reflected (specular) and scattered light is collected by specular/spatial detector (or position sensitive detectors (208, 209)) and scatter detector (or photomultiplier tube) 114 respectively. The reflected and scattered light, along with the beam deflection and the resulting data set, is used to detect and classify micropipes.

Figure 8:
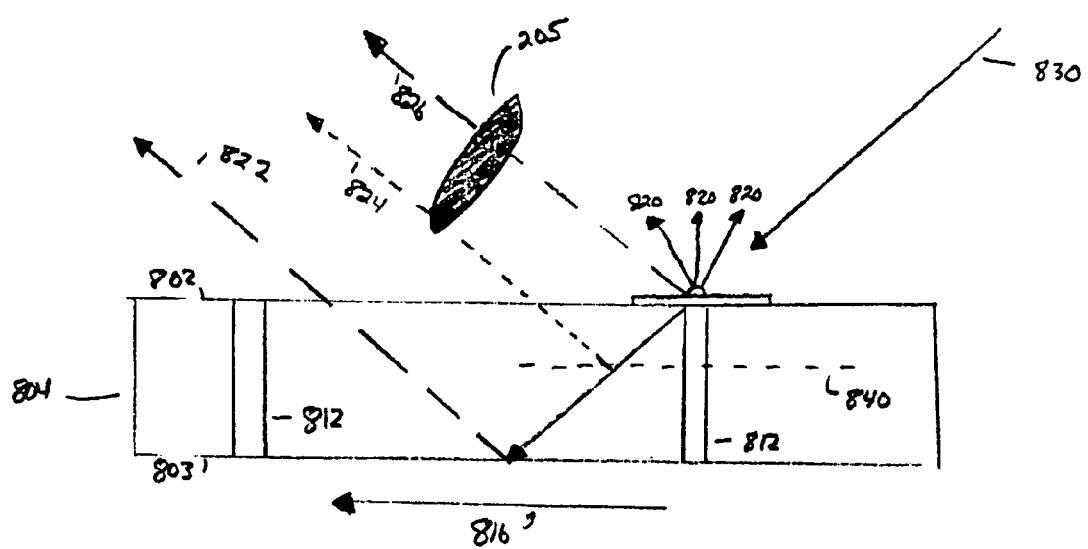
FIG. 8 is an illustration of how a spatial filter is designed to minimize backside influence on a transparent wafer inspection for detection of micropipes, according to one embodiment of the present invention.

As shown in FIG. 8, the incident laser beam 830 penetrates through a transparent wafer 804 and reflect off the back surface 803 of transparent wafer 804 in the form of back surface reflected laser beam 822. In order to avoid contamination of the top surface 802 with the backside information 822, a specially designed spatial filter 205 (as seen in FIG. 2) is placed in the optical path. This spatial filter 205 allows only the light (824, 826) reflected from regions close to the top surface 802 of the transparent wafer 804 to reach the specular/spatial detectors (208, 209). However, the scattered light image 820 does not have the spatial filter 205 and is affected by the back side scattering of the incident laser beam 830. The penetration depth 840 of the incident laser beam 830 can be selected depending on the nature of the sample to be analyzed by varying the field of view of spatial filter 205.

Figure 7A:
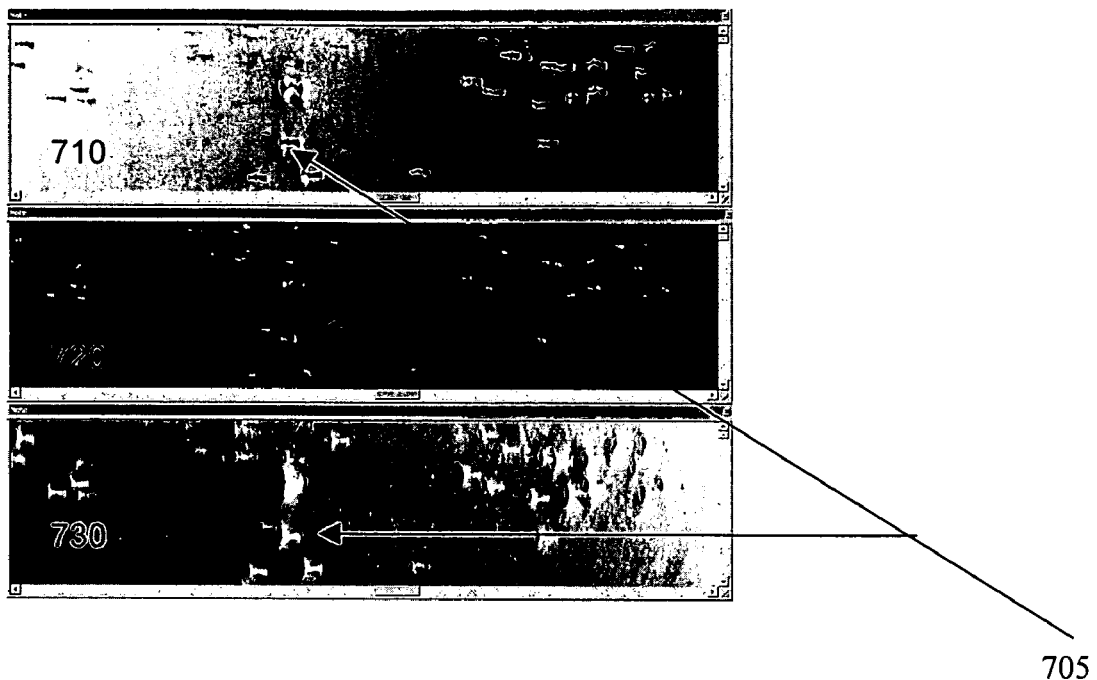
FIG. 7A is a collection of optical surface analysis images showing the optical signature of micropipes on a double side polished silicon carbide (SiC) wafer, according to an embodiment of the present invention.

As the laser 101 traverses in direction 816 over the wafer 804, the specular (reflected) and the scattered light images are acquired by specular/spatial detector 208 and scattered light detector 114, respectively in FIG. 8. The special spatial filter 205 on the reflected beam makes specular/spatial detector 208 insensitive to the light that is scattered from the 'bulk' of the wafer and the bottom surface 803 of the wafer. The 'bulk' of the wafer is defined as the area of the wafer below the top surface 802 and above the penetration depth 840. But, the scattered light detector 114 does not have the spatial filter 205, and will therefore see information from both the 'bulk' and the bottom surface of the wafer. When the micropipes 812 are at an ideal dimension wherein they scatter enough light above the background of the wafer 804, they will appear as streaks of light in the scattered image 720 (as seen in FIG. 7A).

Figure 9:
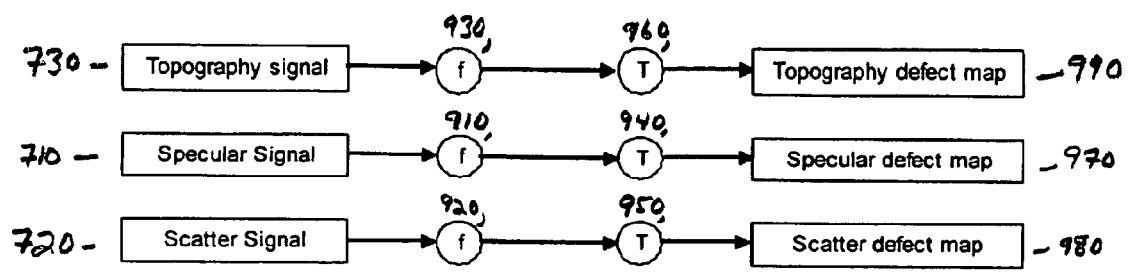
FIG. 9 is an illustration of the use of filtering and thresholding for the purpose of marking a defect area and generating a defect map according to one embodiment of the present invention.
Figure 10A:
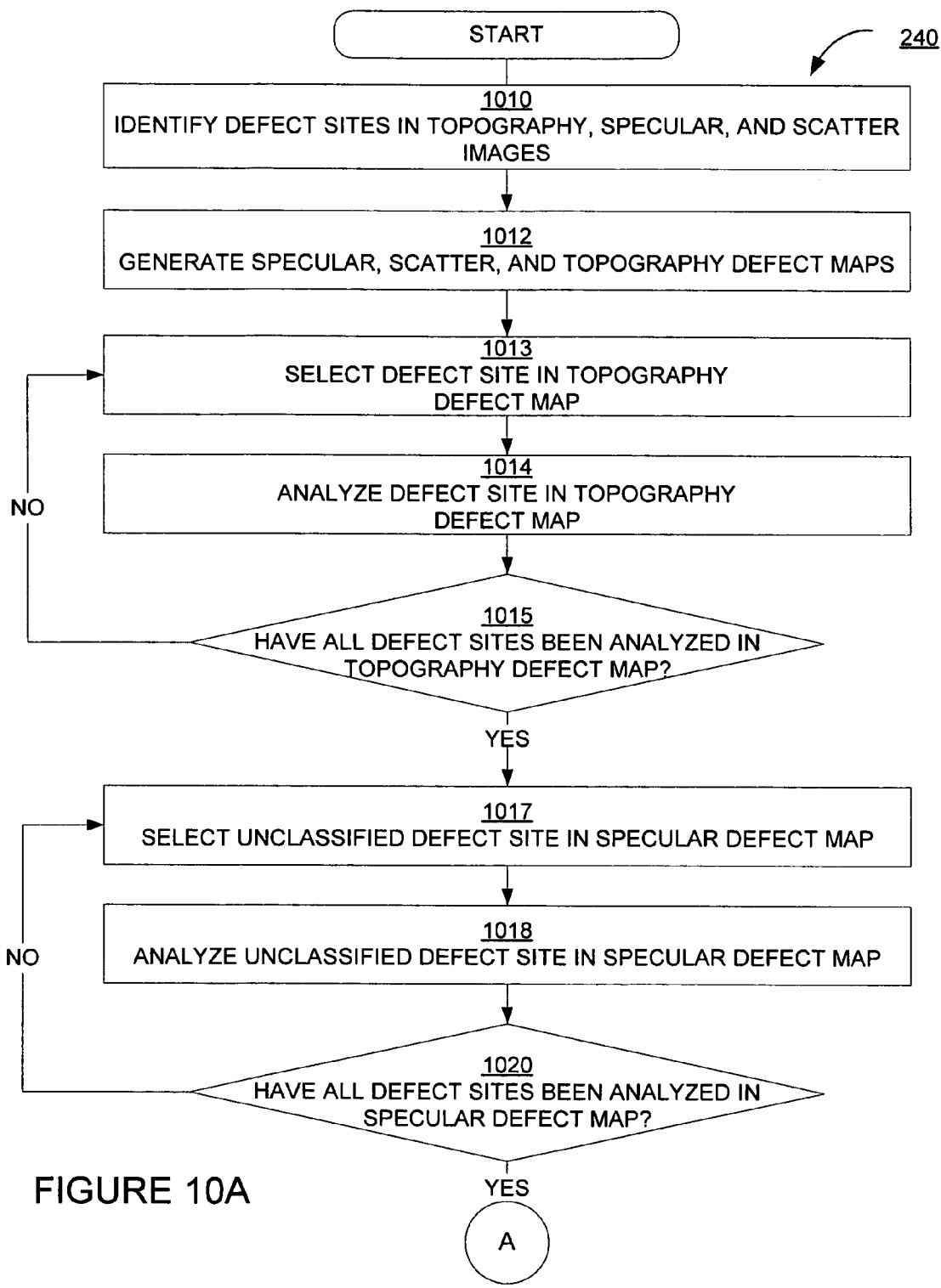
FIGS. 10A and 10B are flow diagrams illustrating defect detection and classification techniques used for identifying micropipes in accordance with one embodiment of the present invention.
Figure 10B:
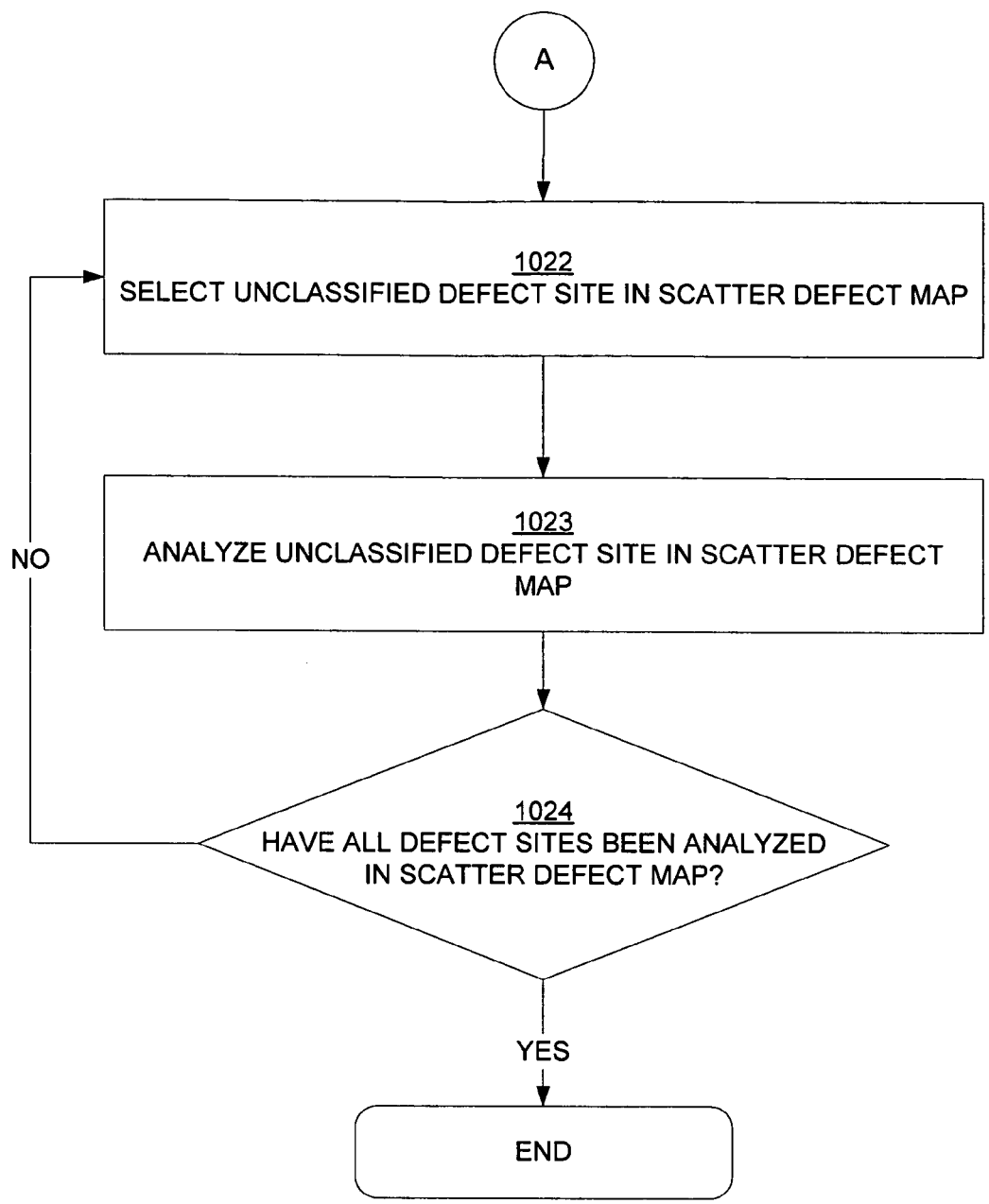

According to one embodiment of the present invention, a defect processing algorithm 240, located within memory unit 220, analyzes defects using the techniques shown in FIGS. 10a and 10b. FIGS. 10a and 10b are flow diagrams illustrating defect detection and classification techniques used for identifying micropipes in accordance with one embodiment of the present invention. The defect processing algorithm 240, identifies 1010 possible defect sites within the topography image 730, specular image 710, and scatter image 720 and generating 1012 topography 990, specular 970, and scatter 980 defect maps. The steps of identifying 1010 defect sites and generating 1012 defect maps is described with reference to FIG. 9.

FIG. 9 is an illustration of the use of filtering and thresholding for the purpose of marking a defect area and generating a defect map according to one embodiment of the present invention. In order to identify 1010 defect sites and to generate 1012 defect maps (990, 970, 980) the present invention receives signals representing the specular image 710, the scatter image 720, and the topography image 730 that were generated using signals received by the specular/spatial detectors (208, 209) and scatter detector 114. The image signals (710, 720, 730) are each processed through a one dimensional median flattening filter (910, 920, 930) to flatten each image and remove the global background (long wavelength) noise of the images, as shown in FIG. 9. The flattening filters (910, 920, 930) also serve as the analysis kernel and is typically set to three to five times the length of the smallest feature to be resolved although other values can be used. For example, typical micropipe signatures are about 100 to 300 microns long on the OSA image and hence an analysis kernel of 1000 microns can be used. The local background noise is measured at various locations on the image and an appropriate analysis threshold (940, 950, 960), i.e., filter, is selected based on the noise level. As the analysis kernel passes through the image, the central data point for each kernel length is compared against the local mean and if the difference exceeds the analysis threshold (940, 950, 960), the data point is marked for further analysis. Such marked areas are identified 1010 as 'defect sites'. FIG. 7A is a collection of optical surface analysis images showing the optical signature of micropipes on a double side polished silicon carbide (SiC) wafer, according to one embodiment of the present invention. A defect site 705 has been identified in the specular image 710, scatter image 720, and topography image 730 of FIG. 7a.

After the specular 710, scatter 720, and topography 730 images are filtered by the flattening filters (910, 920, 930) and background adjusted by the analysis thresholds (940, 950, 960), the result is the generation 1012 of the specular defect map 970, the scatter defect map 980, and the topography defect map 990. A conglomeration of specular, scatter, or topography defect sites constitute a specular 970, scatter 980, or topography 990 defect map. The processed images (710, 720, 730) are used as the primary images for the corresponding defect map (970, 980, 990) when detecting the presence of micropipes.

The defect processing algorithm 240 then selects 1013 a defect site from the defect map and analyzes 1014 the defect site. The defect processing algorithm repeats the selection 1013 and analyzing 1014 steps until 1015 all of the defect sites in the topography defect map has been analyzed. Each defect site that was marked in the defect detection stage is selected for inspection for a pit signature. Certain distinguishing features, e.g., the presence of a pit signature, pit signature area, and pit signature aspect ratio can be used during the analysis of a defect site, according to one embodiment of the present invention.

Figure 11:
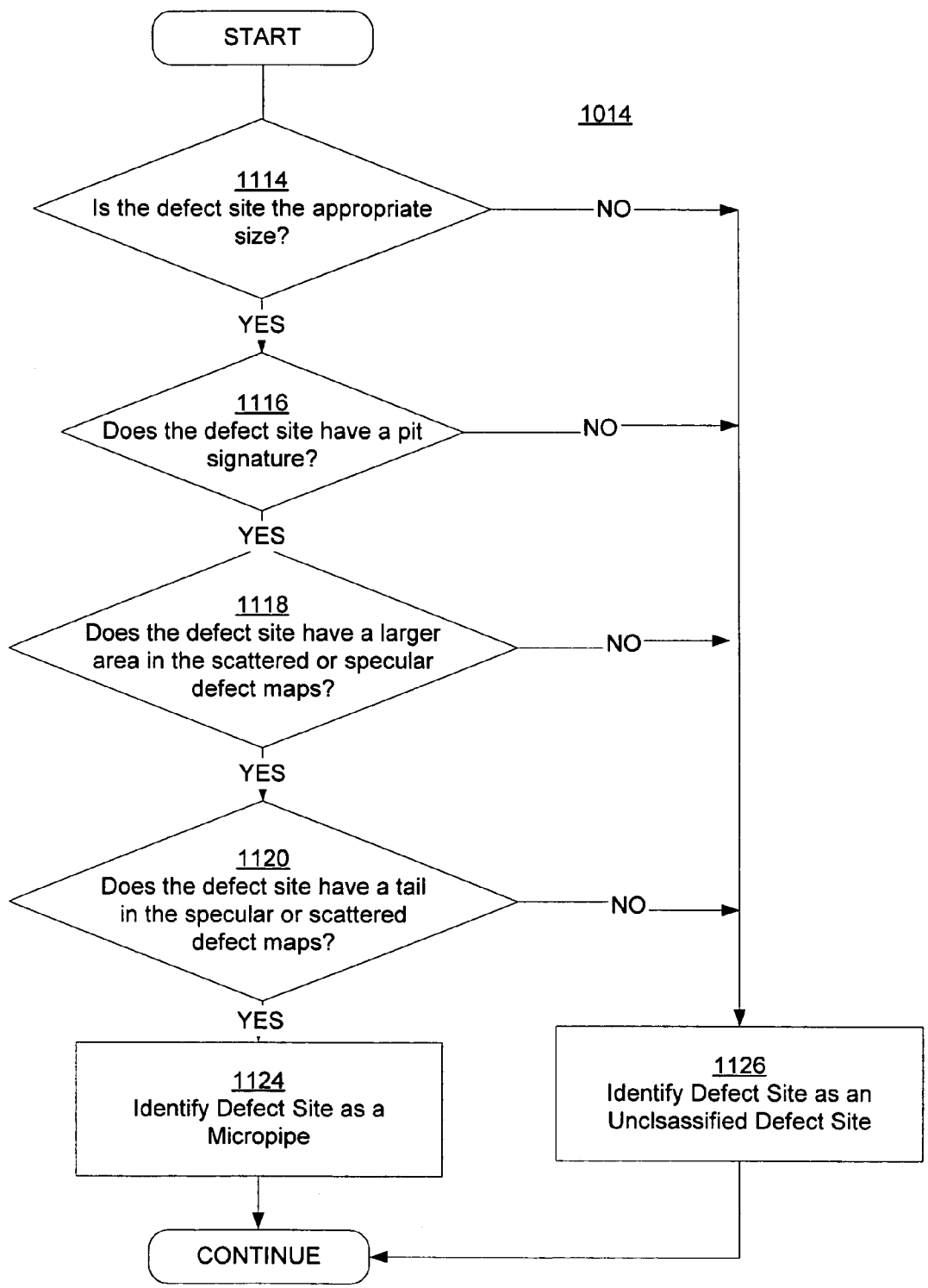
FIG. 11 is a logic flow diagram illustrating the steps taken for analysis of a defect site in a topographic defect map, in accordance with one embodiment of the present invention.

A more detailed description of analyzing 1014 the defect site in the topography map is described in FIG. 11.

FIG. 11 is a logic flow diagram illustrating the steps taken for analysis of a defect site in a topographic defect map, in accordance with one embodiment of the present invention. The defect processing algorithm 240 determines 1114 whether the defect site is an appropriate size. In one embodiment the appropriate size of a potential micropipe is when the circumferential features is approximately 100–300 microns. The parameters for what size constitutes an appropriate size can be determined and changed by modifying a value in the defect processing algorithm. If the defect size is not an appropriate size then the site remains unclassified 1126 and the process continues at step 1015.

The defect processing algorithm 240 then determines 1116 whether the defect site has a pit signature. A pit signature is now described. With reference to FIG. 7a, when the specular image 720 is sensitive only to the surface and near-surface features, a 'pit' like affected region will occur near the micropipe which is followed by a small dark streak resulting from the reduced intensity reaching the specular/spatial detector 208. Depending on the diameter and the orientation of the micropipe, it might appear strongly in either the topography image 730, scatter image 720, or the specular image 710. On wafers with an epitaxial surface the micropipe may cause "hillock" structures to grow on the wafer 804. In such cases, the micropipe might not be visible in the images due to the strong scattering characteristics of the hillocks. For the purpose of this document it is assumed that the user is inspecting bare SiC substrates. As seen in FIG. 7A, the micropipes in SiC are visible in one or more channels of the OSA. In the case of double sided polished wafers, the micropipes can typically be seen clearly in all channels. The opening at the top surface of the wafer exhibits the classical 'pit signature' in the OSA image—a dark spot followed by a bright spot—caused by the decreasing/increasing slope profile across the opening. In the specular 710 and scattered light images 720, the micropipe shows up as a streak that is dark in the specular image 710 and bright in the scattered light image 720. These streaks are oriented in the circumferential direction due to the nature of the scan mechanism on the OSA. For the purpose of this document, elongated pit signatures will be referred to as 'tails'.

In the case of single side polished wafers, the micropipes are primarily classified by the 'pit signature' in the topography images 730, where a micropipe pit signature is analyzed by scanning the topographic image 730 from left to right and locating the alternating dark and light regions. The dark region corresponds to an area of downslope where the leading edge of the pit begins, while the light region corresponds to an area of upslope where the trailing edge of the pit begins. If the defect site does not have a pit signature 1116 then the site remains unclassified 1126 and the process continues at step 1015.

If the defect site does have a pit signature 1116 then the defect processing algorithm 240 determines 1118 whether the defect site has a larger area in the scattered or specular defect maps. As described above, pits show up as sites having a sudden decrease in slope which is immediately followed by a sudden increase in slope. This pit signature is the opposite to the signature of bumps or particles that stick out from the surface of the wafer. Bumps or particles, such as these, are usually smooth and do not have any sharp edges. Hence, they do not show up strongly in either the specular 710 or the scattered light images 720. Thus a comparison of the topography image 730 with the specular 710 and scatter images 720 can help define the pits on the wafer surface. If the defect site area in the topographic image is smaller than the area in either the scattered or specular maps then the site remains unclassified 1126 and the process continues at step 1015.

If the defect site area in the topographic image is larger 1118 than the area in either the scattered or specular maps then the defect processing algorithm 240 determines 1120 whether the defect site has a tail in the corresponding location of the specular image and/or the scattered image. The scatter 720 and specular images 710 exhibit the tails, but this signature may be buried in the noise due to scatter from the backside of the wafer. In either case, the length of the tails seen on the OSA images is almost constant, based on the penetration depth 840, the scan speed, the spatial filter 205 on the specular/spatial detector 208 and the sampling rate used to acquire the images. The present invention determines whether the corresponding location in either the specular 710 or scattered images 720 includes a tail. If the corresponding location in either the specular 710 or scattered images 720 includes a tail then the defect is identified 1124 as a micropipe. Otherwise, the defect the site remains unclassified 1126 and the process continues at step 1015.

Some of the micropipes may have very small openings that do not cause a significant deflection of the incident beam, and hence do not create the pit signature in the topography image. However, they do cause a reduction in reflected light intensity and depending on their orientation may or may not cause an increase in scattered light intensity. Accordingly, in one embodiment of the present invention the scattered and specular defect maps are also analyzed in order to more accurately identify micropipes.

In the embodiment set forth with reference to FIG. 10, after all of the defect sites in the topography defect map have been analyzed the defect sites in the specular defect map are analyzed in the manner described below. In alternate embodiments of the present invention, the analysis of the topography defect map, the specular defect map and the scattered defect map may all occur sequentially, may occur in parallel or in some combination thereof. In addition, the analysis in one or two of the defect maps may not occur. In addition, the individual tests in the analysis 1014 of the defect sites in the topography defect map (steps 1114, 1116, 1118, 11120), the analysis 1018 of the defect sites in the specular defect map (steps 1201, 1202, 1204) and the analysis 1023 of the defect sites in the scatter defect map (1300, 1302, 1304) may be done in any order and one or more of the steps may not occur at all.

Figure 12:
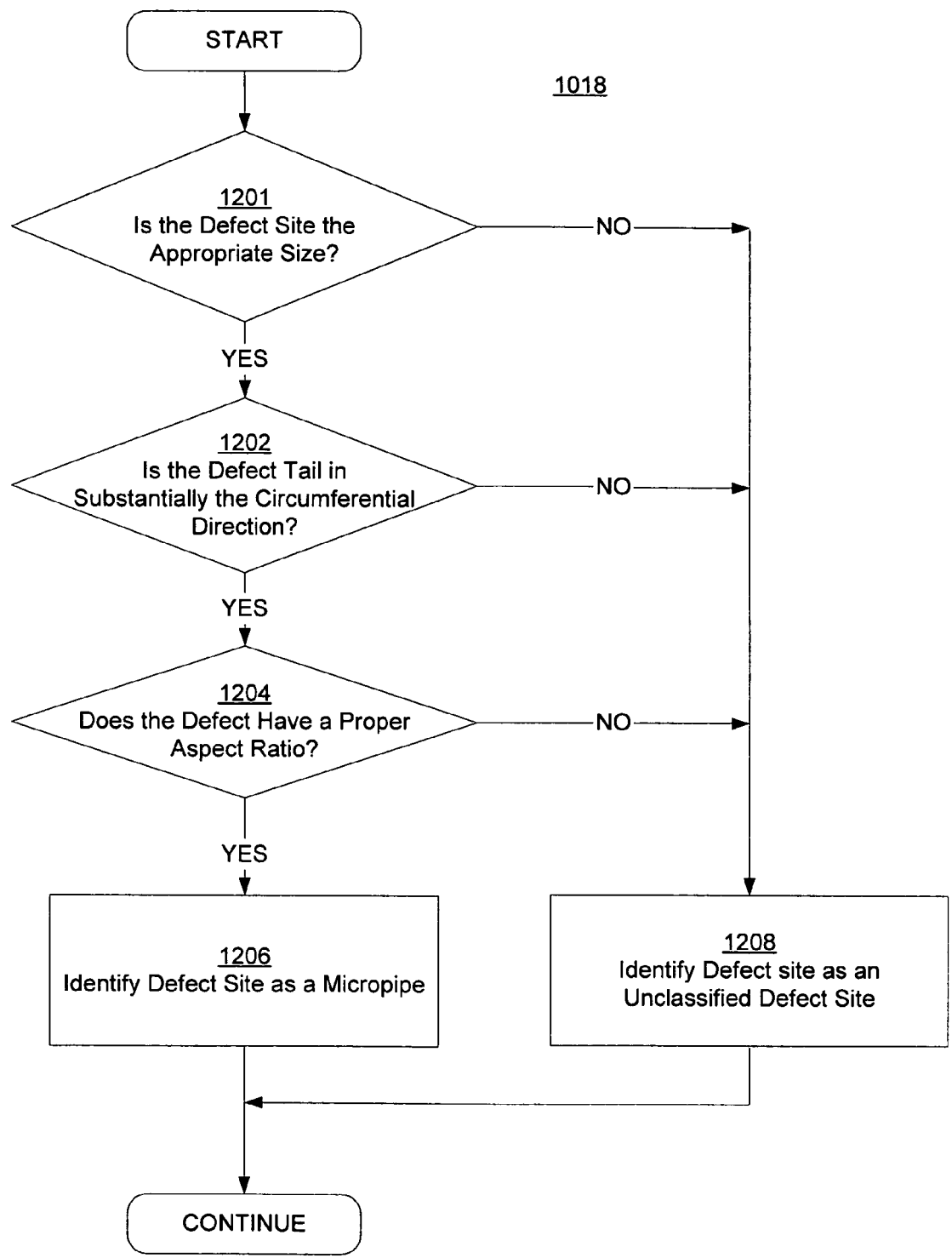
FIG. 12 is a logic flow diagram illustrating the steps taken for analysis of a defect site in a specular defect map, in accordance with one embodiment of the present invention.

When analyzing the defect sites in the specular defect map the defect processing algorithm 240 selects 1017 an unclassified defect site in the specular defect map. An unclassified defect site is one that does not correspond to a defect site that has been previously classified, e.g., in step 1124. The defect processing algorithm 240 then analyzes 1018 the unclassified defect site. Additional details regarding this analysis are set forth in FIG. 12. FIG. 12 is a logic flow diagram illustrating the steps taken for analysis of a defect site in a specular defect map, in accordance with one embodiment of the present invention. The defect processing algorithm 240 determines 1201 whether the defect site is an appropriate size. In one embodiment the appropriate size of a potential micropipe is when the circumferential features is approximately 100–300 microns. The parameters for what size constitutes an appropriate size can be determined and changed by modifying a value in the defect processing algorithm 240. If the defect size is not an appropriate size then the site remains unclassified 1208 and the process continues at step 1020.

If the defect is an appropriate size 1201 then the defect processing algorithm 240 determines 1202 whether the defect site is substantially circumferential. In this step the algorithm looks for circumferential tails in the specular image 710. In one embodiment, substantially circumferential means that the tails of the specular image are substantially in the circumferential direction. In general, micropipes propogate vertically up into the boule during the manufacturing process so that when wafers are sliced from the boule, the micropipes will be substantially vertical within any given wafer. When the micropipe passes through the laser, its shadow/optical signature will lie along the circumferential direction (the direction traveled by the light beam).

That is, micropipes are defects that penetrate into the wafer, and are essentially perpendicular to the top surface that is being scanned by the optics. However, some of them may be at a slight angle from the vertical. Thus, when the micropipes are imaged, the scan mechanism causes the micropipes to appear as circumferential or near circumferential streaks in the image. In order to avoid catching random scratches on the wafer and mislabling them as micropipes, the present invention restricts the micropipe search to features that are substantially circumferential on the images. In one embodiment, the present invention requires that micropipe tail be within 35 degrees of the circumferential direction in order to be considered substantially circumferential.

If the defect tail is in substantially the circumferential direction then the defect processing algorithm 240 determines 1204 whether the defect site has a proper aspect ratio. The proper value of the aspect ratio can vary depending upon the optical aperture (spatial filter), the receiving optics, the refractive index of the material and the wavelength of the light source. The length of the detected micropipe is generally related to the depth of penetration of the laser into the wafer. In one embodiment, for a particular setup and material micropipes big enough to generate a signal typically will have a similar aspect ratio. The value used by the defect processing algorithm 240 to determine whether the aspect ratio is proper can be modified. If the defect site has a proper aspect ratio then the defect processing algorithm identifies 1206 the defect site as a micropipe. Otherwise the defect site remains 1208 unclassified. The process then continues by determining 1020 whether all defect sites have been analyzed in the specular defect map. If there are additional defect sites to be analyzed the process repeats steps 1017 and 1018.

Figure 13:
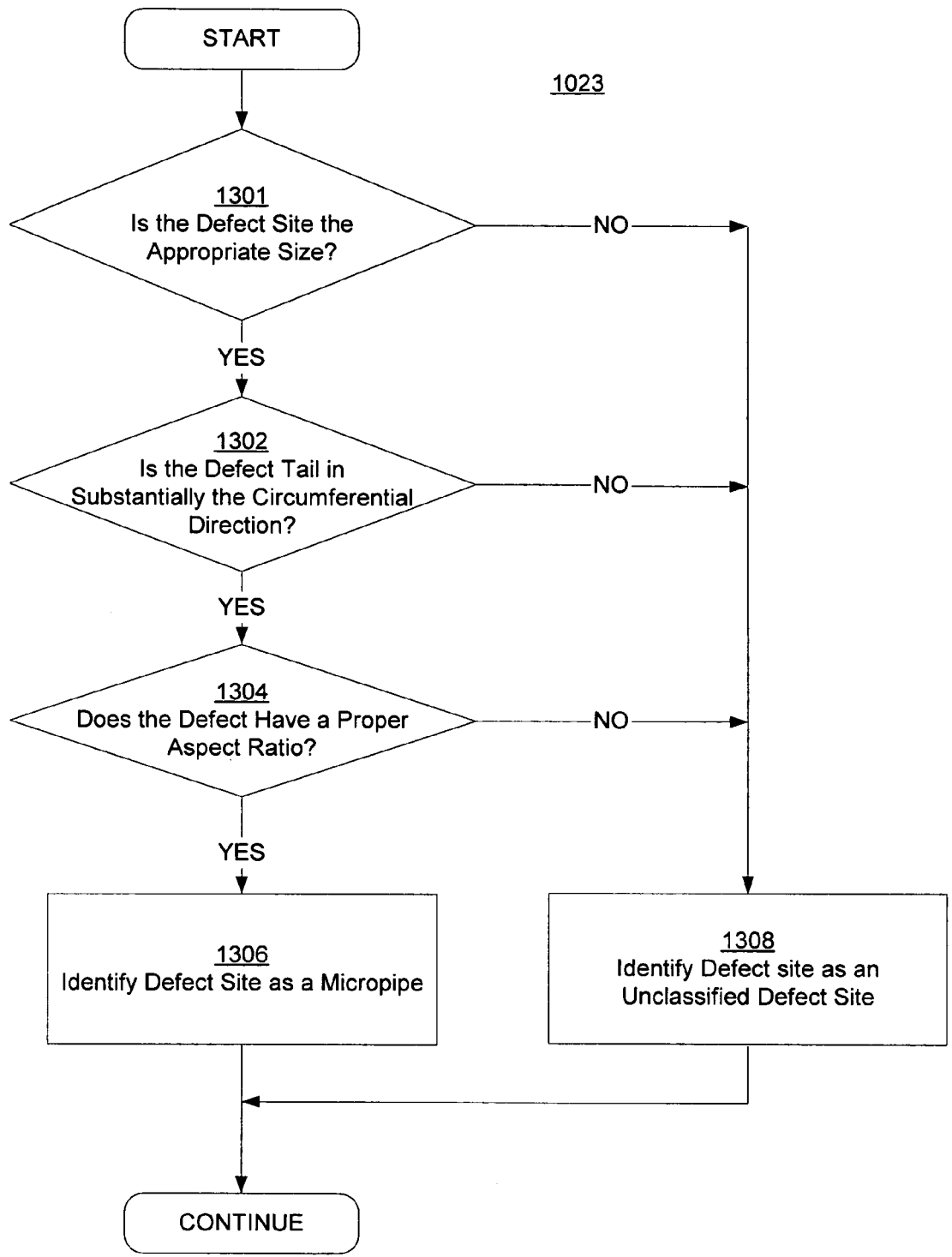
FIG. 13 is a logic flow diagram illustrating the steps taken for analysis of a defect site in a scattered defect map, in accordance with one embodiment of the present invention.

If there are no additional defect sites to be analyzed in the specular defect map the defect processing algorithm 240 selects 1022 an unclassified defect site in the scattered defect map. When analyzing the defect sites in the specular defect map the defect processing algorithm 240 selects 1022 an unclassified defect site in the specular defect map. An unclassified defect site is one that does not correspond to a defect site that has been previously classified, e.g., in step 1124 or 1206. The defect processing algorithm 240 then analyzes 1023 the unclassified defect site. Additional details regarding this analysis are set forth in FIG. 13. FIG. 13 is a logic flow diagram illustrating the steps taken for analysis of a defect site in a scattered defect map, in accordance with one embodiment of the present invention. The analysis of a defect site for a scattered defect map is similar to the analysis of a defect site for a specular defect map, described above. The defect processing algorithm 240 determines 1301 whether the defect site is an appropriate size. In one embodiment the appropriate size of a potential micropipe is when the circumferential features is approximately 100–300 microns. The parameters for what size constitutes an appropriate size can be determined and changed by modifying a value in the defect processing algorithm 240. If the defect size is not an appropriate size then the site remains unclassified 1308 and the process continues at step 1024.

If the defect is an appropriate size 1301 then the defect processing algorithm 240 determines 1302 whether the defect site is substantially circumferential. In this step the algorithm looks for circumferential tails in the specular image 710. In one embodiment, substantially circumferential means that the tails of the specular image are substantially in the circumferential direction. In general, micropipes propagate vertically up into the boule during the manufacturing process so that when wafers are sliced from the boule, the micropipes will be substantially vertical within any given wafer. When the micropipe passes through the laser, its shadow/optical signature will lie along the circumferential direction (the direction traveled by the light beam).

That is, micropipes are defects that penetrate into the wafer, and are essentially perpendicular to the top surface that is being scanned by the optics. However, some of them may be at a slight angle from the vertical. Thus, when the micropipes are imaged, the scan mechanism causes the micropipes to appear as circumferential or near circumferential streaks in the image. In order to avoid catching random scratches on the wafer and mislabling them as micropipes, the present invention restricts the micropipe search to features that are substantially circumferential on the images. In one embodiment, the present invention requires that micropipe tail be within 35 degrees of the circumferential direction in order to be considered substantially circumferential.

If the defect tail is in substantially the circumferential direction then the defect processing algorithm 240 determines 1304 whether the defect site has a proper aspect ratio. The proper value of the aspect ratio can vary depending upon the optical aperture (spatial filter), the receiving optics, the refractive index of the material and the wavelength of the light source. The length of the detected micropipe is generally related to the depth of penetration of the laser into the wafer. In one embodiment, for a particular setup and material micropipes big enough to generate a signal typically will have a similar aspect ratio. The value used by the defect processing algorithm 240 to determine whether the aspect ratio is proper can be modified. If the defect site has a proper aspect ratio then the defect processing algorithm identifies 1306 the defect site as a micropipe. Otherwise the defect site remains 1308 unclassified. The process then continues by determining 1024 whether all defect sites have been analyzed in the specular defect map. If there are additional defect sites to be analyzed the process repeats steps 1022 and 1023.

In other embodiments of the present invention the analysis of the defect sites in the topograph defect map, in the specular defect map and the scattered defect map can occur in different orders or can occur simultaneously.

To detect micropipes, according to one embodiment of the present invention, the entire surface of the wafer is imaged and a cross-correlation between the specular, scatter, and topography images is used. In alternate embodiments, the cross-correlation is not performed and an analysis of a single image is used to identify micropipes. In the case of transparent substrates such as SiC, it has been found that using S-polarized incident light yields the maximum signal amplitude at the detectors.

Figure 7B:
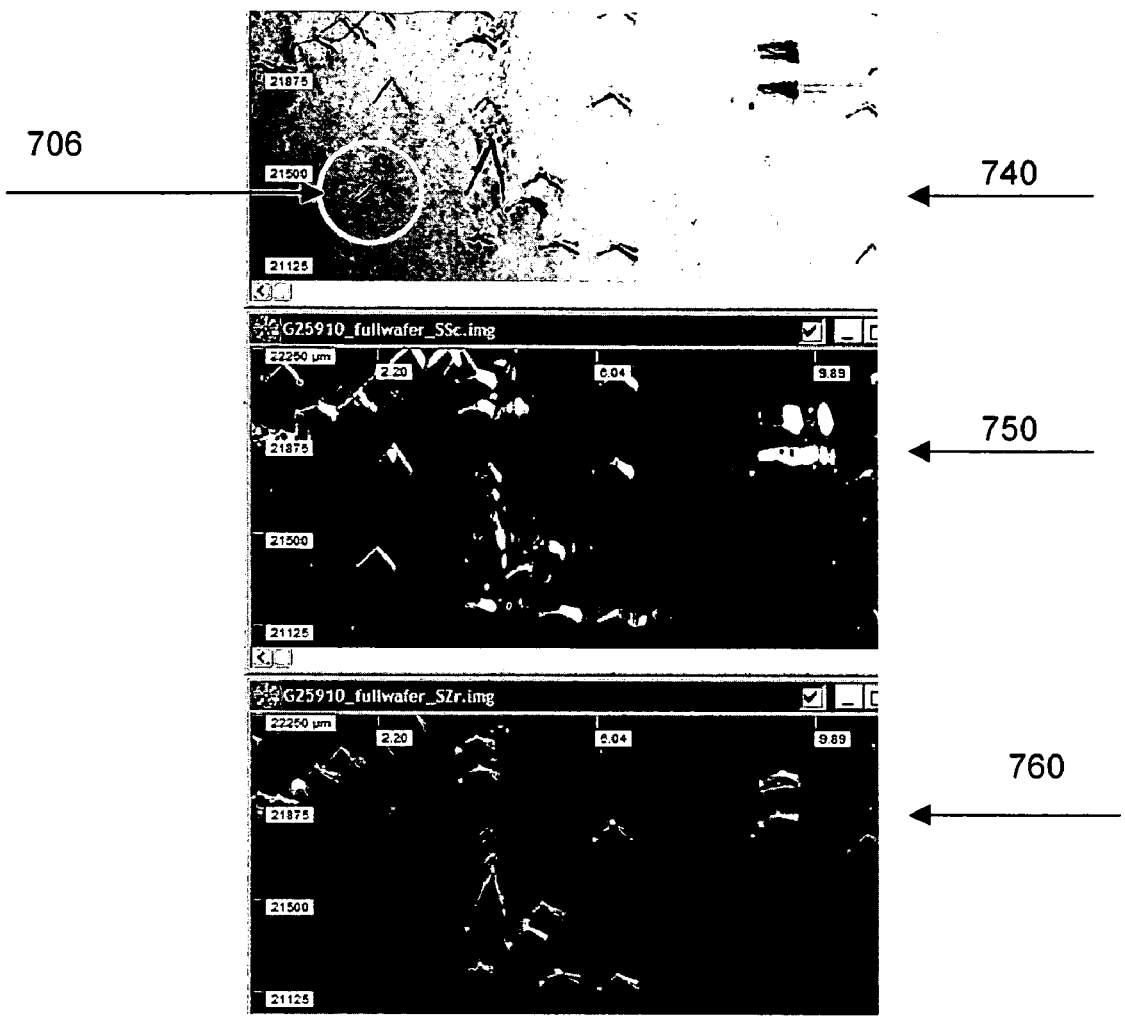
FIG. 7B is a collection of optical surface analysis images showing the optical signature of micropipes on a double side polished SiC wafer, according to an embodiment of the present invention.

Referring to FIG. 7B, in the circumstance that a defect site 706 does not have a strong enough signal to be detected accurately by the topography detector 209, the optics related to detecting a specular image 740 with specular/spatial detector 208 will allow for a more accurate determination of the nature of a defect site 706.

Figure 7C:
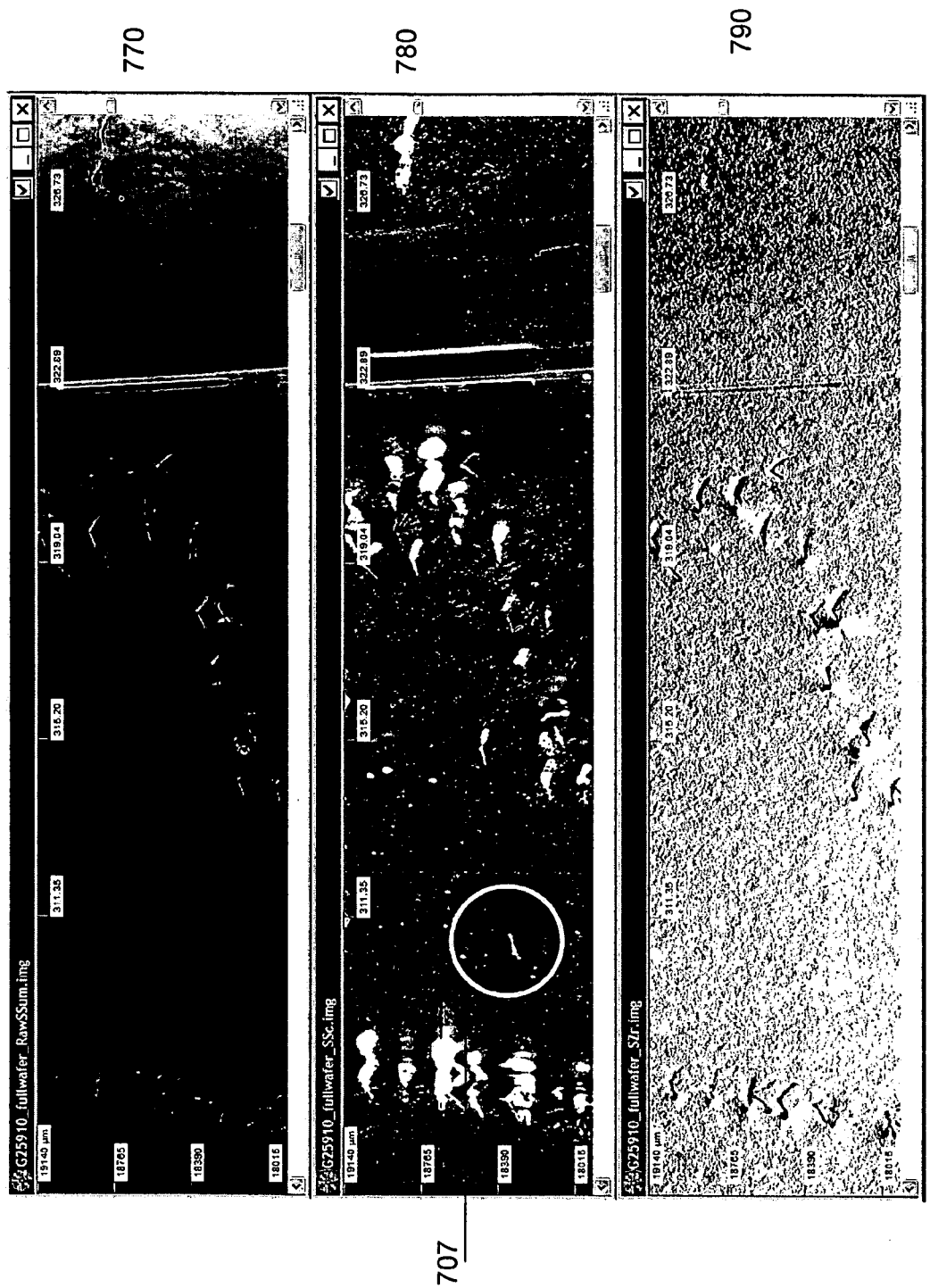
FIG. 7C is a collection of optical surface analysis images showing the optical signature of micropipes on a double side polished SiC wafer, according to an embodiment of the present invention.
Figure 7D:
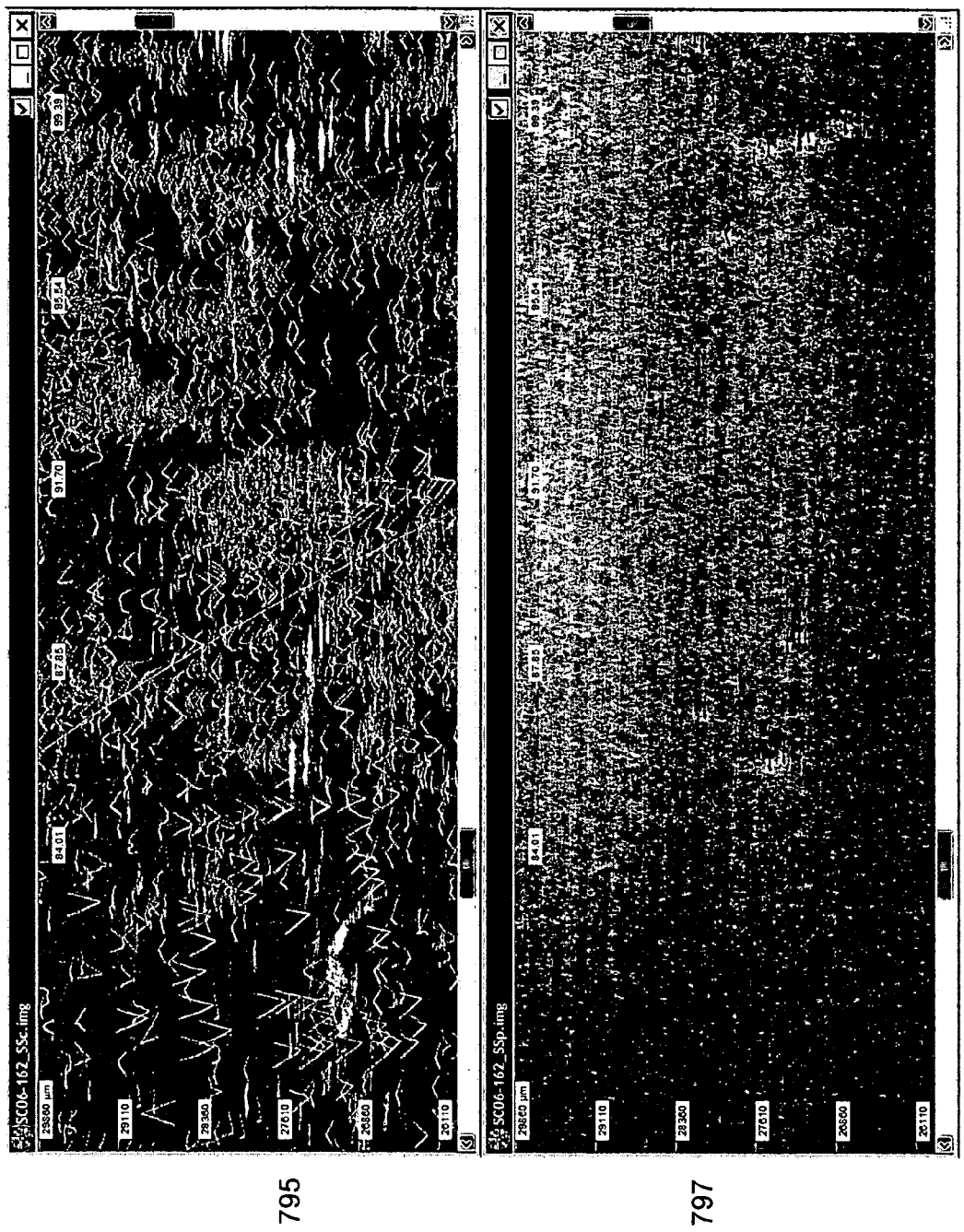
FIG. 7D is a collection of optical surface analysis images showing the optical signature of micropipes on a double side polished SiC wafer, according to an embodiment of the present invention.

Also, there are some cases (FIG. 7C) where both the topography signal 790 and the specular signal 770 are not resolved enough to provide an accurate analysis of a defect site 707, and the scattering signal 780 is used to determine the nature of defect site 707. Through the use of enhanced optics, as described in FIG. 1, thousands of defect sites can be classified within the scattering signal 795, while the specular signal 797 is relatively quiet with regards to defect sites, as shown in FIG. 7D.

With reference to the images of FIG. 7A, the spokes of dark and bright reflectivity areas in the specular 710, scatter 720, and topography 730 images are due to the birefringence of the SiC crystal. The removal of this background variation leads to an accurate defect classification on the SiC wafers.

While the invention has been particularly shown and described with reference to a preferred embodiment and various alternate embodiments, it will be understood by persons skilled in the relevant art that various changes in form and details can be made therein without departing from the spirit and scope of the invention.

The invention claimed is:

1. A computer based method for automatically detecting micropipes on an object comprising the steps of:
   identifying a first defect site on the object;
   analyzing said first defect site having the steps of
      determining a size of said first defect site, and
      determining whether said defect site has a pit signature; and
   automatically identifying a first of said defect sites as a micropipe when said size of said first defect site is substantially a first size, and when said defect site has a pit signature.

2. The method of claim 1, wherein said object is a silicon carbide wafer.

3. The method of claim 1, further comprising the step of:
   generating a first defect list that includes said first defect site, based upon a topography image.

4. The method of claim 1, wherein said step of identifying a first defect site is performed automatically.

5. The method of claim 1, wherein said analyzing step further comprises the step of:
   determining whether said first defect site has a tail in said specular or scattered images;
   wherein said step of automatically identifying identifies a first of said defect sites as a micropipe when said size of said first defect site is substantially a first size, said defect site has a pit signature and when said first defect site has a tail in one of said specular or scattered images.

6. The method of claim 1, wherein said analyzing step further comprises the steps of:
   determining whether said first defect site has a larger area in one of said specular or scattered images; and
   wherein said step of automatically identifying a first of said defect sites identifies said first defect site as a micropipe when said size of said first defect site is substantially a first size, said defect site has a pit signature and when said first defect site has a larger image in one of said specular or scattered images.

7. The method of claim 1, further comprising the steps of:
   analyzing a scattered defect site on the object having the steps of
      determining a size of said scattered defect site, and
      determining whether said scattered defect site is substantially in the circumferential direction of the defect site; and
   automatically identifying said scattered defect site as a micropipe when said size of said scattered defect site is substantially a first size, and when said scattered defect site is substantially in the circumferential direction at the location of the scattered defect site on the object.

8. The method of claim 7, wherein said step of analyzing a scattered defect site further comprises the step of determining whether an aspect ratio of said scattered defect site is within a first aspect range,
   wherein said step of automatically identifying said scattered defect site identifies said scattered defect site as a micropipe when said size of said scattered defect site is substantially a first size, and when said scattered defect site is substantially in the circumferential direction at the location of the scattered defect site on the object and when said aspect ratio is within said first aspect range.

9. The method of claim 7, step of further comprising the step of:
   generating a scattered defect list that includes said scattered defect site, based upon a scattered image.

10. The method of claim 1, further comprising the steps of:
   analyzing a specular defect site on the object having the steps of
      determining a size of said specular defect site, and
      determining whether said specular defect site is substantially in the circumferential direction of the defect site; and
   automatically identifying said specular defect site as a micropipe when said size of said specular defect site is substantially a first size, and when said specular defect site is substantially in the circumferential direction at the location of the specular defect site on the object.

11. The method of claim 10, wherein said step of analyzing a specular defect site further comprises the step of determining whether an aspect ratio of said specular defect site is within a first aspect range,
   wherein said step of automatically identifying said specular defect site identifies said specular defect site as a micropipe when said size of said specular defect site is substantially a first size, and when said specular defect site is substantially in the circumferential direction at the location of the specular defect site on the object and when said aspect ratio is within said first aspect range.

12. The method of claim 10, step of further comprising the step of:
   generating a specular defect list that includes said specular defect site, based upon a specular image.

13. A method for automatically detecting micropipes on an object comprising the steps of:
   identifying a scattered defect site on the object;
   analyzing a scattered defect site on the object having the steps of
      determining a size of said scattered defect site, and
      determining whether said scattered defect site is substantially in the circumferential direction of the defect site; and
   automatically identifying said scattered defect site as a micropipe when said size of said scattered defect site is substantially a first size, and when said scattered defect site is substantially in the circumferential direction at the location of the scattered defect site on the object.

14. The method of claim 13, wherein said object is a silicon carbide wafer.

15. The method of claim 13, further comprising the step of:
   generating a first scattered list that includes said first scattered site, based upon a scattered image.

16. The method of claim 13, wherein said step of identifying a scattered defect site is performed automatically.

17. The method of claim 13, wherein said step of analyzing a scattered defect site further comprises the step of determining whether an aspect ratio of said scattered defect site is within a first aspect range,
   wherein said step of automatically identifying said scattered defect site identifies said scattered defect site as a micropipe when said size of said scattered defect site is substantially a first size, and when said scattered defect site is substantially in the circumferential direction at the location of the scattered defect site on the object and when said aspect ratio is within said first aspect range.

18. A method for automatically detecting micropipes on an object comprising the steps of:
   identifying a specular defect site on the object;
   analyzing said specular defect site on the object having the steps of
      determining a size of said specular defect site, and
      determining whether said specular defect site is substantially in the circumferential direction of the defect site; and
   automatically identifying said specular defect site as a micropipe when said size of said specular defect site is substantially a first size, and when said specular defect site is substantially in the circumferential direction at the location of the specular defect site on the object.

19. The method of claim 18, wherein said object is a silicon carbide wafer.

20. The method of claim 18, further comprising the step of:
   generating a first specular list that includes said first specular site, based upon a specular image.

21. The method of claim 18, wherein said step of identifying a specular defect site is performed automatically.

22. The method of claim 18, wherein said step of analyzing a specular defect site further comprises the step of determining whether an aspect ratio of said specular defect site is within a first aspect range,
   wherein said step of automatically identifying said specular defect site identifies said specular defect site as a micropipe when said size of said specular defect site is substantially a first size, and when said specular defect site is substantially in the circumferential direction at the location of the specular defect site on the object and when said aspect ratio is within said first aspect range.

* * * * *